United States Patent
Ranganathan et al.

(10) Patent No.: US 7,944,230 B1
(45) Date of Patent: May 17, 2011

(54) METHODOLOGY AND APPARATUS FOR REDUCTION OF SOFT ERRORS IN LOGIC CIRCUITS

(75) Inventors: Nagarajan Ranganathan, Tampa, FL (US); Koustav Bhattacharya, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 12/882,835

(22) Filed: Sep. 15, 2010

Related U.S. Application Data

(62) Division of application No. 12/484,708, filed on Jun. 15, 2009, now Pat. No. 7,804,320.

(60) Provisional application No. 61/061,293, filed on Jun. 13, 2008.

(51) Int. Cl.
*H03K 19/003* (2006.01)
(52) U.S. Cl. ............................. 326/15; 326/14; 326/26
(58) Field of Classification Search ............... 326/14, 326/15, 26
See application file for complete search history.

(56) References Cited

U.S. PATENT DOCUMENTS

| | | | | |
|---|---|---|---|---|
| 4,914,629 A * | 4/1990 | Blake et al. | ...... | 365/154 |
| 4,956,814 A * | 9/1990 | Houston | ...... | 365/154 |
| 6,058,041 A * | 5/2000 | Golke et al. | ...... | 365/156 |
| 6,111,780 A * | 8/2000 | Bertin | ...... | 365/154 |
| 2005/0134323 A1* | 6/2005 | Nash | ...... | 327/40 |

* cited by examiner

*Primary Examiner* — Rexford N Barnie
*Assistant Examiner* — Thienvu V Tran
(74) *Attorney, Agent, or Firm* — Molly L. Sauter; Smith & Hopen, P.A.

(57) ABSTRACT

The present invention includes a circuit-level system and method for preventing the propagation of soft errors in logic cells. A radiation jammer circuit in accordance with the present invention, including an RC differentiator and a depletion mode MOS circuit, when inserted at the output of a logic cell, significantly reduces the propagation of transient glitches. The radiation jammer circuit is a novel transistor-level optimization technique, which has been used to reduce soft errors in a logic circuit. A method to insert radiation jammer cells on selective nodes in a logic circuit for low overheads in terms of delay, power, and area is also introduced.

11 Claims, 10 Drawing Sheets

TABLE II
EXPERIMENTAL RESULTS FOR ON ISCAS'85 BENCHMARK CIRCUITS

| Benchmark Circuit | % Reduction in SER | | | % Delay Overhead | | | % Area Overhead | | |
|---|---|---|---|---|---|---|---|---|---|
| | M=1% | M=5% | M=10% | M=1% | M=5% | M=10% | M=1% | M=5% | M=10% |
| c432 | 6.20 | 18.76 | 32.54 | 0.18 | 0.37 | 0.54 | 2.72 | 9.53 | 19.07 |
| c499 | 4.95 | 15.41 | 28.85 | 0.00 | 0.05 | 0.23 | 2.33 | 9.35 | 18.70 |
| c880 | 17.74 | 44.46 | 61.76 | 0.07 | 0.20 | 0.43 | 2.18 | 9.48 | 18.97 |
| c1355 | 4.07 | 13.67 | 25.33 | 0.00 | 0.06 | 0.06 | 2.39 | 9.56 | 19.13 |
| c1908 | 14.25 | 36.70 | 53.00 | 0.09 | 0.09 | 0.28 | 2.31 | 9.84 | 19.11 |
| c2670 | 18.39 | 64.91 | 76.27 | 0.07 | 0.07 | 0.32 | 2.17 | 9.54 | 18.66 |
| c3540 | 16.71 | 39.49 | 54.01 | 0.00 | 0.02 | 0.05 | 2.13 | 9.43 | 18.56 |
| c5315 | 18.81 | 43.36 | 59.42 | 0.00 | 0.00 | 0.00 | 1.93 | 9.45 | 18.72 |
| c6288 | 30.54 | 50.33 | 62.43 | 0.00 | 0.00 | 0.00 | 1.90 | 9.33 | 18.58 |
| c7552 | 14.14 | 41.58 | 59.38 | 0.02 | 0.33 | 0.42 | 1.94 | 9.35 | 18.57 |
| AVG | 14.58 | 36.87 | 51.30 | 0.04 | 0.12 | 0.23 | 2.20 | 9.49 | 18.81 |

FIG. 8

METHODOLOGY AND APPARATUS FOR REDUCTION OF SOFT ERRORS IN LOGIC CIRCUITS

CROSS REFERENCE TO RELATED APPLICATIONS

This application is a divisional claiming the benefit of the filing date of pending U.S. patent application Ser. No. 12/484,708, entitled, "Methodology and Apparatus for Reduction of Soft Errors in Logic Circuits", filed on Jun. 15, 2009, which claims priority to U.S. Provisional Patent Application No. 61/061,293, entitled, "Methodology and Apparatus for Reduction of Soft Errors in Logic Circuits", filed on Jun. 13, 2008.

BACKGROUND

Technology scaling trends pose a significant challenge in designing reliable computer systems due to the occurrences of transient faults. A major source of transient faults in computer circuits is due to the generation of soft errors which occur when the energetic neutrons coming from space or the alpha particles arising out of packaging materials hitting the transistors. A soft error may manifest itself as a bit flip in a memory element or it can occur in any internal node of a combinational logic and subsequently propagate to and be captured in a latch. In the past, soft errors have been handled at the circuit level using schmitt triggers, adding duplicate cells and clamping the voltage between the duplicate nodes, and addition of pass transistors to filter the random glitches that lead to soft errors. However, these approaches for avoiding soft errors in logic circuits often incur significant overheads in terms of delay, area and power. Although, soft errors have been a greater concern for memory elements, technology trends like smaller feature sizes, lower voltage levels, higher operating frequency and reduced logic depth, are projected to increase the soft-error rate (SER) in combinational logic beyond that of unprotected memory elements. In a recent study, the SER of logic circuits were quantified in technology nodes from 600 nm to 50 nm and it was projected that by 2011, the SER in logic circuits will increase by nine orders of magnitude and will essentially be comparable to unprotected memory.

Several approaches have been proposed in the literature to protect VLSI circuits against soft errors. Since memories were particularly susceptible to radiation induced soft errors, many approaches have focused to radiation-harden memory cells and few have actually focused on prevention of soft errors in logic circuits. Many approaches known in the art mitigate soft errors using detection and correction techniques mostly by using spatial and temporal redundancy. In the prior art, time redundancy is exploited to detect and recover from soft-errors. Additionally, a technique for correction of logic soft errors using c-elements has been proposed. It is known to add concurrent error detection circuits to nodes in logic circuits which have high soft error susceptibility. Some works reported in literature prevent the generation of transient faults by sizing the individual gates of a logic circuit. Prior art designs asymmetric logical masking probability of nodes in a logic circuit is exploited to selectively resize gates. An optimization framework based on geometric programming is used for simultaneous dual-VDD assignment and sizing in also known in the art. The authors of the present invention have proposed a technique to reduce SER in logic circuits by simultaneous sizing and flip-flop selection. Soft errors can also be prevented in logic circuits by using various circuit level optimization techniques. In the art soft error protection in domino logic and sequential cells is achieved by explicitly adding capacitors to the feedback node. These ideas have been extended to combinational logic circuits. However, as the stored charge in the keeper becomes smaller due to technology scaling, the technique becomes inefficient in fighting transient glitches due to radiation strikes. In other prior art solutions, gates are locally duplicated and the duplicate nodes are connected by a voltage clamper circuit. This prevents the output node of the gate and its duplicate node from deviating in voltage due to a radiation strike. This technique, however, doubles the area and power overhead. The effect is especially severe for complex cells or cells with higher drive strengths. Adding shadow gates for such cells with a large silicon footprint makes the area and power overhead significant. In another prior art solution, the logic gates that are bombarded by radiation strikes are isolated using complimentary pass gates. The complimentary pass gates act as a low pass filter and filters out transient voltage pulses due to a radiation strike. In an additional prior art solution, a class of soft error masking circuits is proposed using a Schmitt trigger circuit. These techniques, however, can achieve a marginal reduction in the radiation induced glitch magnitude but cannot completely eliminate the transient.

A need exists in the art for an improved methodology and circuit for the reduction of soft errors in logic circuits that provides a marginal increase in delay, power consumption and area overhead.

SUMMARY OF THE INVENTION

The present invention includes a method and apparatus based on circuit-level optimization for reduction of SER of logic circuits with marginal delay, power, and area overheads. This method and apparatus are novel attempts towards SER reduction in logic circuits using a transistor-level optimization with low overhead.

In accordance with the present invention, a system to prevent the propagation of a single event transient glitch from a driving logic cell to a driven logic cell is provided, the system includes a resistor-capacitor (RC) differentiator circuit electrically coupled to an output of the driving logic cell, the RC differentiator circuit comprising a resistive circuit and a capacitive circuit, the resistive circuit coupled between the output of the driving logic cell and the capacitive circuit and a depletion mode metal oxide semiconductor (MOS) circuit electrically coupled between the output of the driving logic cell and an input to the driven logic cell, the depletion mode MOS circuit comprising at least one depletion mode MOS transistor and the resistive circuit of the RC differentiator circuit coupled across a gate and a body of the at least one depletion mode MOS transistor such that the transient glitch voltage across the resistive circuit puts the at least one depletion mode MOS transistor in cut-off, thereby disconnecting the driving logic cell from the driven logic cell to prevent the propagation of the transient glitch.

The resistive circuit of the RC differentiator of the present invention may be an NMOS transistor having a drain coupled to the output of the driving logic cell, a gate coupled to a voltage supply and a source coupled to the capacitive circuit. Alternatively, the resistive circuit may be a poly strip having a first end coupled to the output of the driving logic circuit and a second end coupled to the capacitive circuit. The resistive circuit must provide a small enough resistance to obtain a large voltage drop across resistive circuit during the transient glitch.

In a particular embodiment, the capacitive circuit comprises an NMOS transistor and a PMOS transistor, the NMOS transistor having a gate coupled to the resistive circuit and a source and a drain coupled to a ground supply and the PMOS transistor having a gate coupled to the resistive circuit and a source and a drain coupled to a voltage supply.

In a particular embodiment, the depletion mode MOS circuit of the present invention includes a depletion mode NMOS transistor coupled in series with a depletion mode PMOS transistor, the NMOS transistor having a drain coupled to the output of the driving circuit and a source coupled to a drain of the PMOS transistor and the PMOS device having a source coupled to the input of the driven logic circuit. In this embodiment, a gate of the depletion mode NMOS transistor is coupled to the output of the driving logic cell and a body of the depletion mode NMOS transistor is coupled to a node between the resistive circuit and the capacitive circuit. In addition, a gate of the depletion mode PMOS transistor is coupled to the output of the driving logic cell and a body of the depletion mode NMOS transistor is coupled to a node between the resistive circuit and the capacitive circuit.

In a specific embodiment of the present invention, a system to prevent the propagation of a single event transient glitch from a driving logic cell to a driven logic cell is provided which includes a first NMOS transistor having a drain coupled to an output of the driving logic cell and a gate coupled to a voltage supply, a second NMOS transistor having a gate coupled to a source of the first NMOS transistor and a drain and a source coupled to a ground supply, a PMOS transistor having a gate coupled to the source of the first NMOS transistor and a drain and a source coupled to the voltage supply, a depletion mode NMOS transistor having a gate and a drain coupled to the output of the driving logic cell and a body coupled to the source of the first NMOS transistor and a depletion mode PMOS transistor having a gate coupled to the output of the driving logic cell, a drain coupled to a source of the depletion mode NMOS transistor, a body coupled to the source of the first NMOS transistor and a source coupled to the input to the driven logic cell.

The present invention provides a method to prevent the propagation of a single event transient glitch from a driving logic cell to a driven logic cell, the method includes receiving a transient glitch at an output of a driving logic cell, generating a voltage drop across a resistive element of a resistor-capacitor (RC) differentiator circuit coupled to the output of the driving logic cell, the voltage drop generated as a result of the received transient glitch and controlling a gate-body voltage of a depletion mode MOS device with the voltage drop generated across the resistive element, wherein the depletion mode MOS device is coupled between the output of the driving logic cell and an input to the driven logic cell, and wherein the voltage drop generated across the resistive element as a result of the transient glitch is sufficient to place the depletion mode MOS device in cut-off, thereby disconnecting the driving logic cell from the driven logic cell to prevent the propagation of the transient glitch.

In the present invention, a substantially constant capacitance value is maintained across a capacitive element of the RC differentiator circuit for a predetermined voltage range.

In a particular embodiment of the present invention, the depletion mode MOS device comprises a depletion mode NMOS transistor in series with a depletion mode PMOS transistor, and when the gate-body voltage resulting from the transient glitch is positive, the depletion mode NMOS transistor is placed in cut-off and when the gate-body voltage resulting from the transient glitch is negative, the depletion mode PMOS transistor is placed in cut-off.

The method of the present invention further includes, inserting a radiation jammer circuit between the driving logic cell and the driven logic cell, the radiation jammer circuit comprising the RC differentiator circuit and the depletion mode MOS device. To reduce the delay and area of the circuit, the radiation jammer circuit is inserted selectively on soft error vulnerable nodes in the non-critical paths of the integrated circuit.

In order to determine the insertion nodes for the radiation jammer circuits, the method of the present invention includes the steps of: performing technology mapping to generate a mapped netlist of gate outputs, computing a cumulative probability of observability value for each gate output of the netlist, computing a slack value for each gate output of the netlist, computing a probability for radiation jammer circuit insertion value for each gate output of the netlist and selecting the top M % of the gates based on the probability for radiation jammer circuit insertion value for insertion of radiation jammer circuit.

In computing the cumulative probability of observability value for each gate output of the netlist, the method of the present invention includes: computing the logical observability for each gate output, computing the electrical observability for each gate output, computing the timing window observability for each gate output and computing the cumulative probability of observability value by summing the logical observability, the electrical observability and the timing window observability.

In computing a slack value for each gate output of the netlist, the method of the present invention includes: computing the earliest arrival time for each gate output, computing the latest arrival time for each gate output and computing the slack value as the difference between the earliest arrival time and the latest arrival time.

In computing a probability for radiation jammer circuit insertion value for each gate output of the netlist, the method of the present invention further includes the step of computing a weighted combination of the slack value and the cumulative probability of observability value.

The value of M can be varied to obtain a desired soft error reduction in combination with a desired area and delay overhead.

BRIEF DESCRIPTION OF THE DRAWINGS

For a fuller understanding of the invention, reference should be made to the following detailed description, taken in connection with the accompanying drawings, in which:

FIG. 8 is a table illustrating the experimental results for ISCAS '85 benchmark circuits in accordance with the present invention.

DETAILED DESCRIPTION OF THE PREFERRED EMBODIMENT

Figure 1:
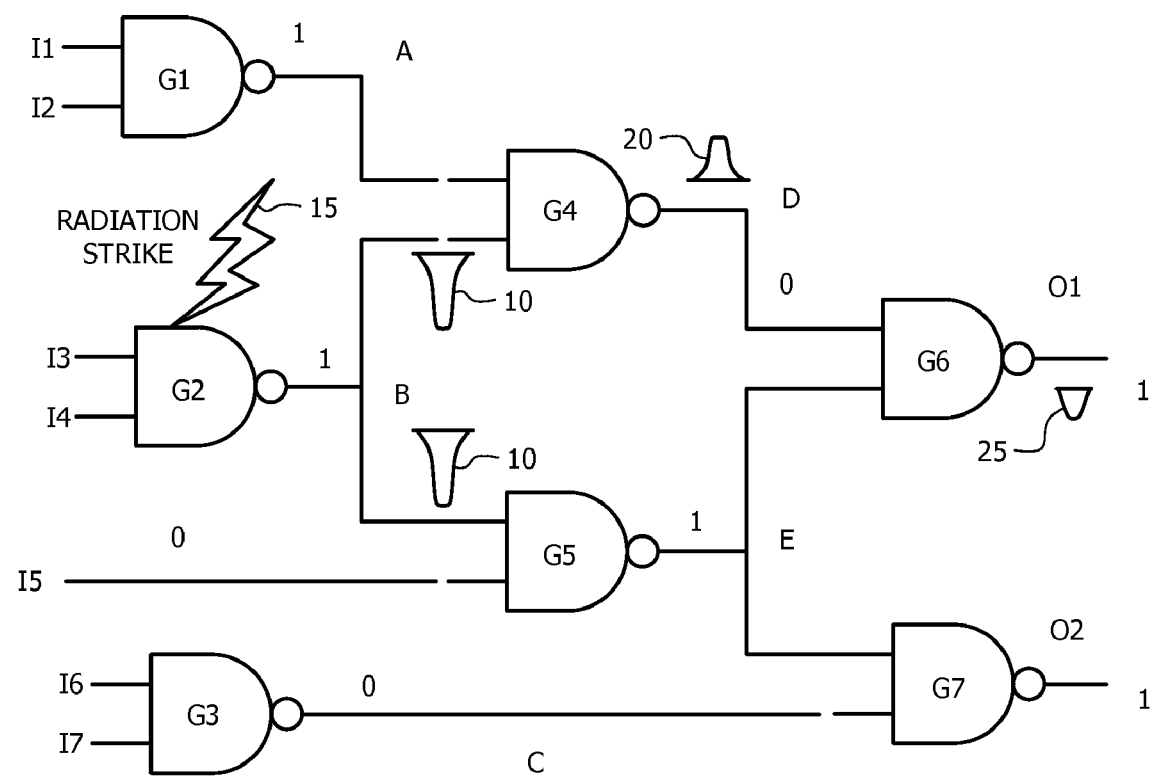
FIG. 1 is a schematic diagram illustrating the masking effects in an exemplary circuit.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Achieving reliability against transient faults in logic circuits poses a significant challenge due to technology scaling trends. Several optimization techniques have been presented in the prior art for preventing soft errors in logic circuits. However, most approaches for avoiding such errors have significant overheads in terms of delay, area, or power. The present invention presents a circuit-level technique that prevents soft errors in logic cells. The circuit in accordance with the present invention significantly reduces the propagation of random glitches due to transient strikes.

The occurrences of random radiation-induced energetic neutron strikes are generally distributed uniformly in space and time. The probability of a particle strike in a circuit node is thus roughly proportional to its active area. The charge deposition at a particular circuit node is traditionally modeled by a double exponential current pulse $I_{in}(t)$, which can be represented as, $$I_{in}(t) = \frac{Q}{\tau_\alpha - \tau_\beta}\left(e^{-\frac{t}{\tau_\alpha}} - e^{-\frac{t}{\tau_\beta}}\right) \quad (1)$$

where Q is the charge deposited as a result of a particle strike, $\tau_\alpha$ is the collection time constant of the junction, and $\tau_\beta$ is the ion-track establishment time constant. $\tau_\alpha$ and $\tau_\beta$ are generally defined by process parameters. A threshold critical charge, $Q_{crit}$, marks the onset of the double exponential current pulse behavior described above. Although the characteristics of a transient pulse at a node depend on the energy distribution of the incident particle, the drive strength of the gate, and the critical charge, various masking factors determine whether the transient pulse can actually propagate to the primary outputs/latches/flip-flops and result in a soft error. There are three primary factors that can potentially mask radiation induced transients:

(1) Logical masking occurs when there is no sensitized path from the gate node where the transient pulse occurs to any of the primary outputs. The transient pulse is filtered when it arrives at an input of a gate where any of the other inputs are at a controlling logic value (2) Electrical masking occurs due to electrical attenuation of the transient pulse in a sensitized path, from its occurrence at a particular gate node to any of the primary outputs. Thus, the extent of electrical masking depends on the electrical property of the gates of the sensitized path.

(3) Timing-window masking occurs when the transient pulse does arrive at the primary output with sufficient strength to cause a soft error but it is sufficiently separated in time from the arrival of the clock edge. As the latch only samples its input on the clock edge, and as the transient pulse is momentary, it does not effectively lead to a soft error.

The masking effects described above are illustrated with reference to FIG. 1. As shown in the figure, a transient pulse 10 is generated on net B due to a radiation strike 15 on the active area of gate G2. The transient pulse is logically masked at the output of gate G5 as its other input is at its controlling value (0). However, the transient pulse is sensitized 20 through gate G4 and suffers some electrical attenuation. The pulse is further attenuated 25 through gate G6. If the transient pulse 25 at the primary output is of sufficient strength it may lead to a soft error provided it is within a timing window of the clock edge, i.e., the pulse must arrive some time before the clock edge (set-up time constraint) and stay until some time after the clock edge (hold-time constraint).

These masking effects thus cause the internal circuit nodes to have varying levels of susceptibility to soft errors. Soft error rates also depend on environmental factors such as altitude.

The present invention provides a circuit level technique for reducing the transient pulses generated due to radiation strikes. The circuit is based on an RC (resistor-capacitor) differentiator implemented in CMOS, which utilizes the exponential voltage spike generated during a radiation strike to detect the occurrence of a single event transient (SET) and to disconnect the driving cell from the driven cell. The circuit of the present invention is referred to as a radiation jammer circuit.

Figure 2:
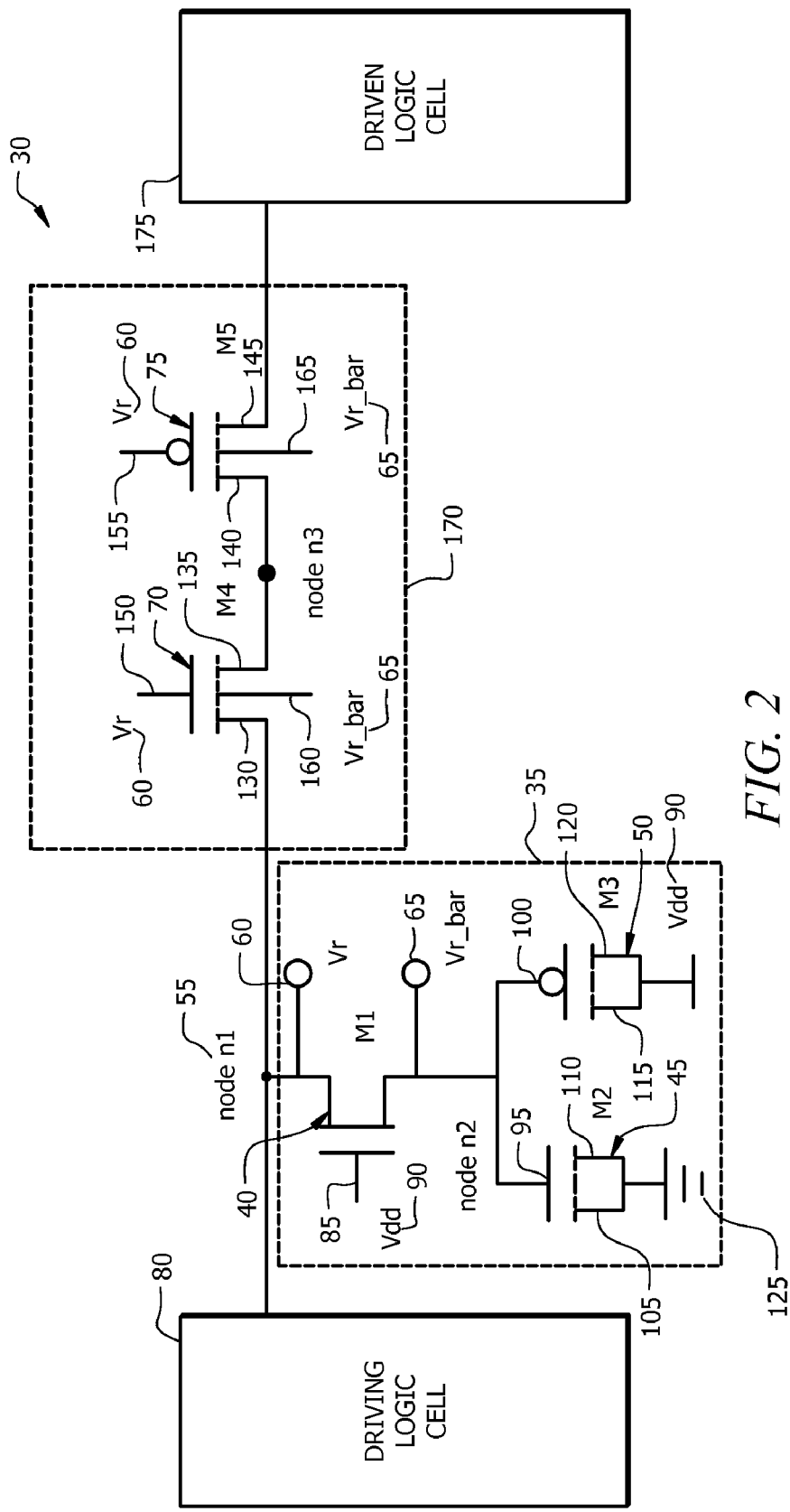
FIG. 2 is a schematic of the radiation jammer circuit in accordance with the present invention.

The transistor-level schematic of the radiation jammer circuit 30 of the present invention is shown in FIG. 2. As shown in FIG. 2, the circuit consists of an RC differentiator 35 implemented with MOS transistors M1 40, M2 45 and M3 50. The resistive circuit of the RC differentiator is provided by a small, always on, NMOS transistor M1 40 provides sufficient resistance to obtain a large voltage swing during radiation strikes. The small resistance can also be implemented using a simple poly strip, thereby eliminating the need for the M1 transistor 40. In this configuration the small, always on, NMOS transistor M1 40 has a drain coupled to the output of the driving logic cell 80, a gate 85 coupled to a voltage supply Vdd 90 and a source coupled to the capacitive circuit of the RC differentiator. The capacitive circuit is formed by a NMOS transistor M2 45 and a PMOS transistor 50 having their gates 95, 100 coupled to the source 65 of the NMOS transistor 40 of the resistive circuit. The drain 105 and source 110 of the NMOS transistor 45 are coupled to a ground supply 125. The drain 115 and the source 120 of the PMOS transistor 50 are coupled to a voltage supply Vdd 90. NMOS and PMOS transistors M2 45 and M3 50 provide a good constant capacitance value across a voltage range. The use of this configuration is motivated by the idea that the current that flows through M1 40 is proportional to the change in voltage across the node n1 55. In particular the current flowing through M1 40, acting as a resistor is given by:

$$I(t) = C_{eff} \frac{d(V_{n1})}{dt} \quad (2)$$

Where $C_{eff}$ is the effective capacitance due to the NMOS and PMOS transistors M2 45 and M3 50. The voltage swing across M1 40 is proportional to this current. As shown in the figure, the voltage, with respect to ground, on the drain 60 and source 65 of M1 40 are Vr and Vr_bar respectively.

During a radiation strike, the voltage across M1 40 is very high. This voltage is used to control the gate-body voltage of the depletion type NMOS and PMOS transistors M4 70 and M5 75. As shown in FIG. 2, M4 70 and M5 75 are coupled in series. The drain 130 of the depletion mode NMOS transistor 70 is coupled to the output 55 of the driving logic circuit 80. The gate 150 of the depletion mode NMOS transistor 70 is coupled to Vr 60 and the body 160 of the depletion mode NMOS transistor 70 is coupled to Vr_bar 65. The drain 140 of the depletion mode PMOS transistor 75 is coupled to the source 135 of the depletion mode NMOS transistor 70. The gate 155 of the depletion mode PMOS transistor 75 is coupled to Vr 60 and the body 165 of the depletion mode PMOS transistor 75 is coupled to Vr_bar 65. The drain 145 of the depletion mode PMOS transistor 75 is then coupled to the input to the driven logic cell 175. Since M4 70 and M5 75, are depletion mode devices they are normally on and a negative voltage has to be applied to make them go into cutoff. During a regular logic transition, the voltage on node n1 55 changes in a comparatively slower ramp and therefore the voltage across M1 40 is small. Thus, during a regular logic transition the voltage across M1 40 is not enough to cut off M4 70 or M5 75.

However, during a single event transient due to a radiation strike, the change in voltage of node n1 55 is exponential, which leads to a large voltage drop across M1 40. This voltage drop is sufficient to cut-off depletion mode transistor M4 70 or M5 75.

Figure 3:
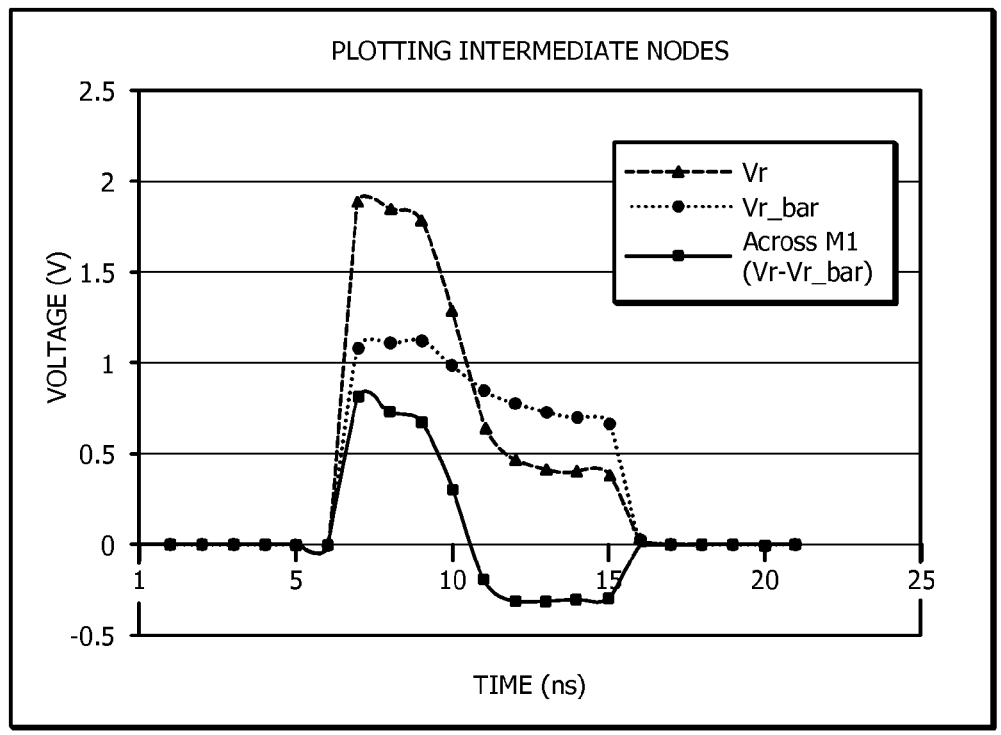
FIG. 3 is a graph illustrating the transient node voltages denoted by Vr and Vr_bar.

In FIG. 3, the transient node voltages denoted by Vr and Vr_bar are illustrated. It should be noted that during the rising phase of the radiation induced transient pulse, the voltage difference swing is positive and the depletion mode PMOS device M5 75 cuts off, while if the voltage swing is negative, the depletion mode NMOS device M4 70 cuts off. It should also be noted that a small positive or negative voltage appears across M1 40 during regular logic transitions as well. Since the magnitude of this voltage is small due to the comparatively slower changing voltage ramp of the output node during regular logic transitions, it does not cut off the depletion mode transistors M5 75 or M4 70 respectively.

Figure 4A:
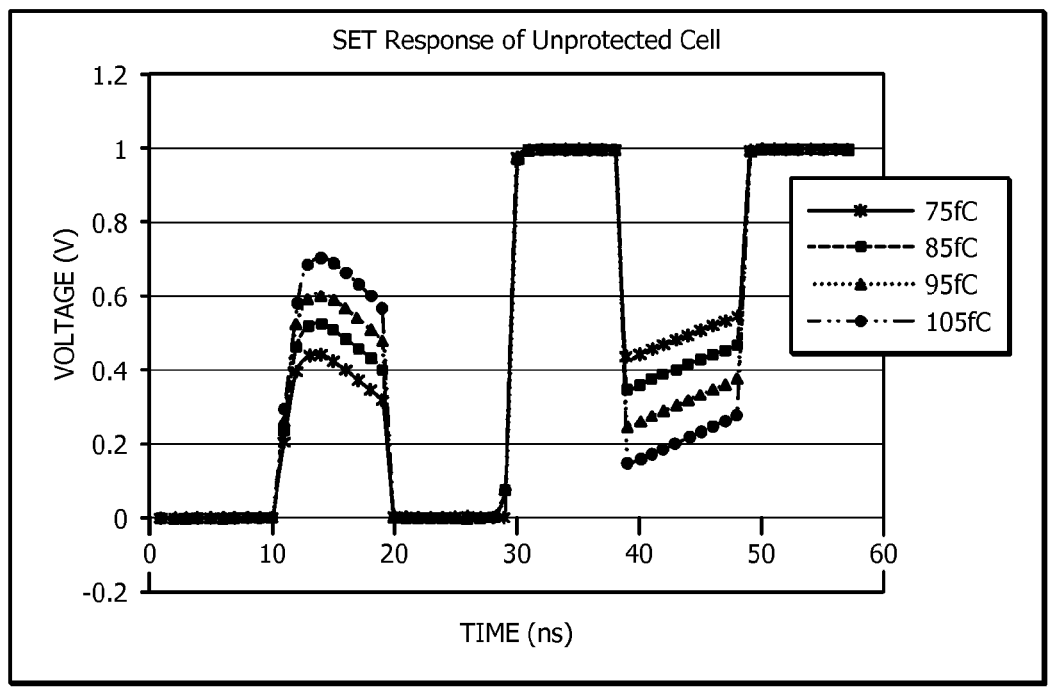
FIG. 4A is a graph illustrating transient pulses on the inverter cell due to radiation strikes of varying strength.
Figure 4B:
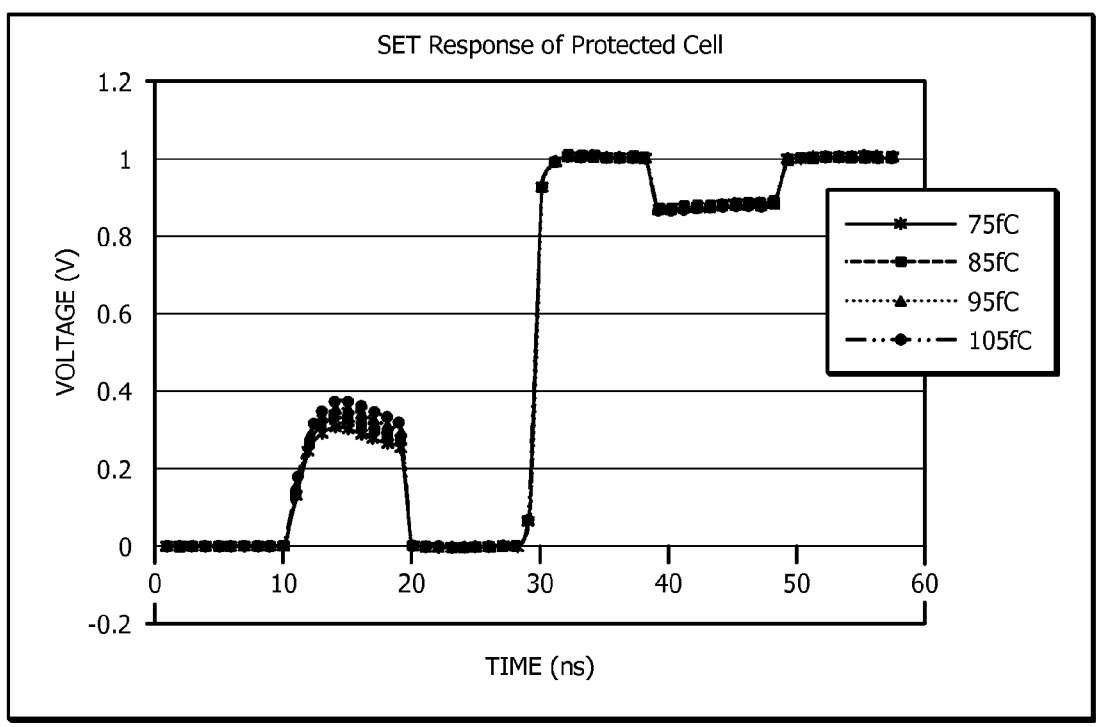
FIG. 4B is a graph illustrating the corresponding results (in relation to FIG. 3) on an inverter cell with the radiation jammer circuit in accordance with the present invention.

Experiments were performed using 45 nm processing on a simple inverter cell hit by a radiation strike. FIG. 4(A) illustrates the transient glitches generated due to radiation strikes of varying strength on the inverter cell. FIG. 4(B) shows the corresponding results for the inverter cell employing the radiation jammer circuit in accordance with the present invention.

The radiation jammer circuit in accordance with the present invention is effective in reducing transients due to radiation strikes, but employing the circuit also has an impact on the area and the delay when attached to the output of a standard cell. A generalized approach to reduce the area overhead is with the use of more compound/complex gate realizations. A compound gate is formed by the combination of series and parallel MOS structures with complementary pull-up and pull-down logic. As these gates are built using static CMOS style, they are referred to as static CMOS complex gates (SCCG). The limitation with SCCG gates is that if the number of transistors in series exceeds an upper limit in any path or pull-up or pull-down logic, then there is a hostile effect on the propagation delay of the gate. Typically, this upper bound can be safely fixed to three or even four transistors. Thus, complex logic gates can be provided as input during the technology mapping phase and the nodes in the corresponding circuit can be protected using the radiation jammer circuit in accordance with the present invention. This technique does reduce the overhead for the proposed approach; however, if all the logic gates are protected with a radiation jammer circuit, then the area and delay overhead of the entire circuit can still be significant. Accordingly, a method that exploits the asymmetric distribution of masking probability to optimize only selective node of a logic circuit is utilized in combination with radiation jammer circuit.

The three masking factors: logical masking, electrical masking and timing window masking and their effects on the generation of soft errors were previously discussed. The observability metric is inversely proportional to the masking effect of each node. Thus, the nodes with high observability have lower soft error masking ability than the nodes with low observability and vice-versa. The glitch enabling probability (GEP) of each net connected to a gate input is defined as the probability that a glitch at the gate input will propagate to the gate output. The GEP of a gate input is computed as the product of the probabilities that all other inputs of a gate are at the gate's enabling value. Thus, mathematically, the GEP of input i of gate j can be computed as, $$GEP_{ij} = \prod_{k \in inputs(j), k \neq i} P_{enab}(k) \quad (3)$$

Where inputs (j) is the set of all inputs to gate j and $P_{enab}(k)$ is the probability that input k is at its enabling value. The enabling value for a gate input depends on the type of gate. For example, for an AND function the enabling value is logic 1 and the enabling probability given is, $$P_{enab}(k) = P_s(k) \quad (4)$$

Where $P_s(k)$ is the signal probability of input k, i.e. the probability that the input k is at logic 1. For the OR function the enabling value is logic 0 and the enabling probability is given by, $$P_{enab}(k) = 1 - P_s(k) \quad (5)$$

Given the signal probabilities of the primary inputs, the signal probabilities of the internal circuit nodes can be calculated. Thus, depending on the function of a particular input and the type of gate itself, the GEP values of each gate input can be calculated. Thus, the signal probabilities and the GEP values of all internal nodes can be calculated using a forward pass through the circuit by visiting circuit nodes in the topologically sorted order from the primary inputs to the primary outputs. The logical observability of each net is defined as the probability that a glitch on that net will propagate to any primary output of the circuit. The computation of the logical observability of a net is based on the GEP values for gate inputs. The logical observability of a net is 1 for primary output nets. Given the logical observability of the output net of a gate, the logical observability at a input net i of the gate j is given as, $$LogicalObserv(i) = GEP_{ij} \times LogicalObserv(j) \quad (6)$$

Thus, the logical observability of each input of a gate is calculated recursively by multiplying the logical observability of its output net with the GEP of the corresponding input net. The logical observability of the stem of a fanout node is computed by considering the maximum logical observability of all its branches. Thus, the logical observability of a net is computed using a backward pass of the structural netlist in the topologically sorted order from the primary output towards the primary inputs. The logical observability thus obtained is finally normalized by dividing it with the maximum logical observability of all nets in the circuit.

Figures 5A, 5B, 5C:
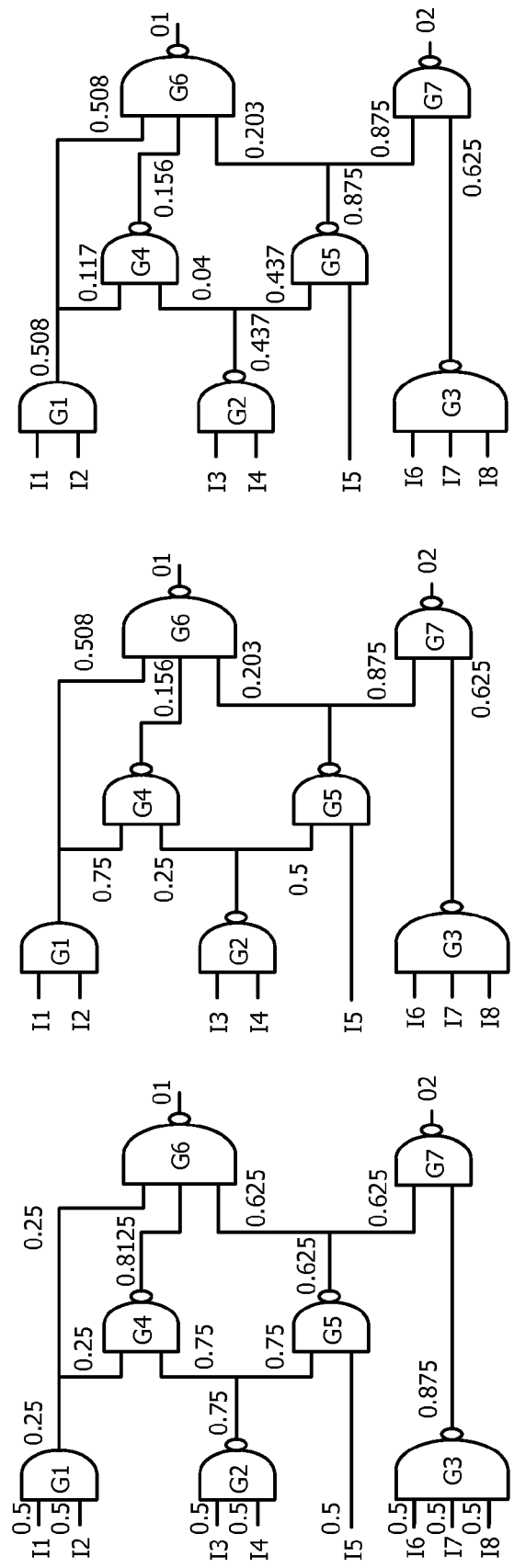
FIG. 5A is a schematic illustration of the signal probabilities of nets related to the computation of the logic observability in accordance with the present invention.
FIG. 5B is a schematic illustration of the GEP values of internal gate inputs related to the computation of the logic observabiity in accordance with the present invention.
FIG. 5C is a schematic illustration of the logical observability values at various gate outputs in accordance with the present invention.

In FIG. 5, the computation of the logical observability for an example circuit is illustrated. The signal probabilities of internal nets are computed using the signal probabilities of the primary inputs. So signal probability of G2 is computed by taking the product of signal probabilities of inputs 13 and 14, which is 0.25. As G3 is a NAND gate, the product of the signal probabilities gives the probability of the output at logic 0. Since the probability of the output of gate G3 to be at logic 0 is 0.125, the signal probability of that net has the value 0.875. Thus a forward pass through the structural netlist in the topologically sorted order provides the signal probabilities of all nets and is shown in FIG. 5(A). Since the circuit consists of just NAND and AND the enabling value of all gate inputs is logic 1. So for this circuit, the probability of an input to be at its enabling value is the same as its signal probability. The GEP of each gate input can thus be computed by using equation 3 and using the previously computed signal probabilities. The computed GEP values of all gates with internal nets as inputs are shown FIG. 5(B). The logical observability values for gates with internal nets as their outputs are then computed using a backward pass of the structural netlist using equation 6. As previously discussed, the logic observability for a stem is computed by taking the maximum of the logical observability of the branches. Thus, the logical observability of the output of gate G1 is computed by taking the maximum of 0.508 and 0.117 which is 0.508. The computed observability values of all gate with outputs as internal nets is shown in FIG. 5(C).

Figure 6:
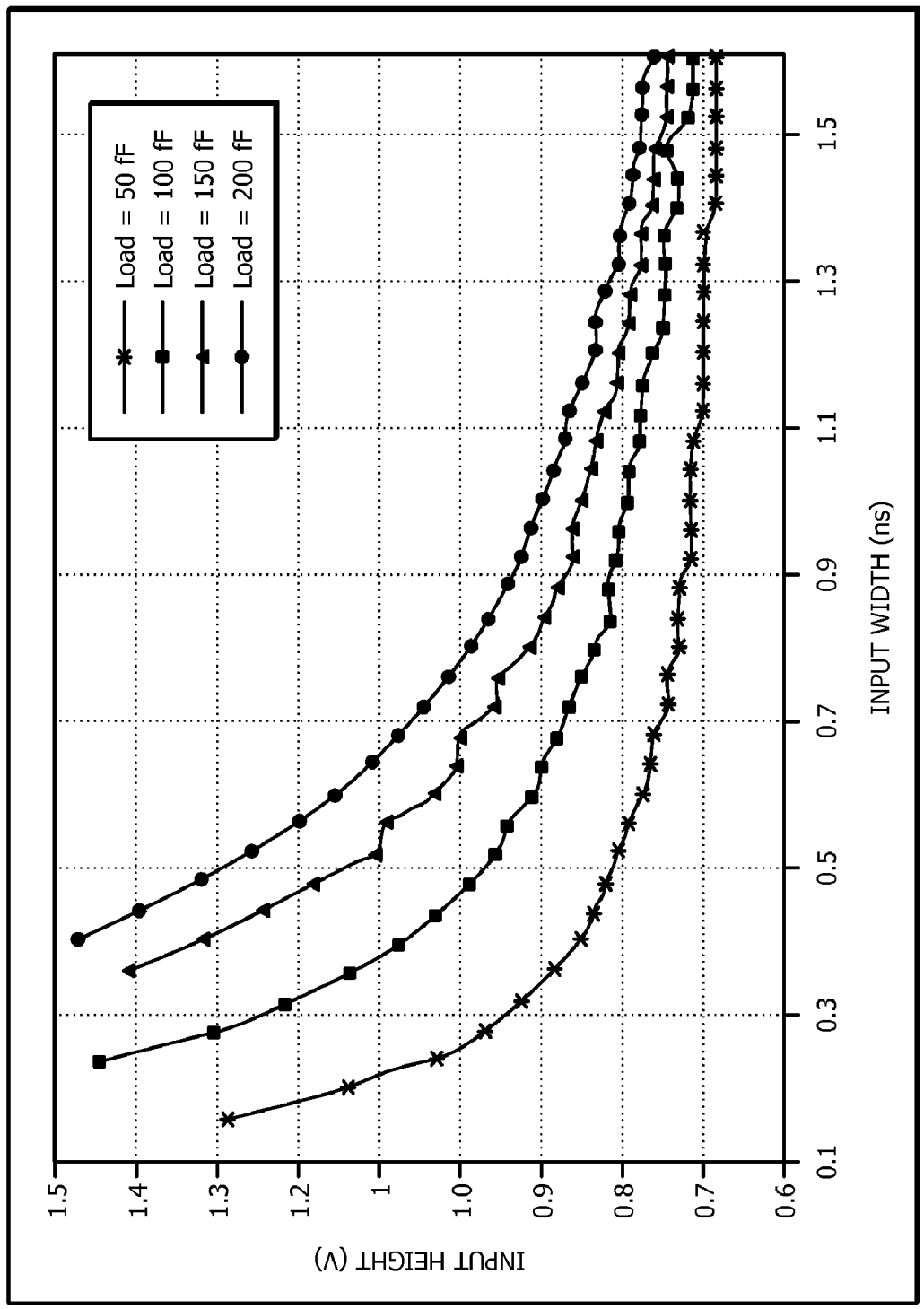
FIG. 6 is a graph illustrating the noise rejection curves (NRC) for an inverter at varying capacitive loads.

The strength of electrical masking for a particular gate can be estimated by creating noise rejection curves (NRC) for that gate type. The NRC for an inverter cell with gate length of 180 nm is shown in FIG. 6. The x-axis denotes the input noise width and the y-axis denotes the input height. All radiation induced SET which are below the NRC curve are noise-immune. In other words, either they have a width below the corresponding NRC or they have a height to the left of the NRC. Radiation induced SET which are above the NRC are noise-sensitive. Thus, the area under the NRC divided by the area over the NRC corresponds to the electrical masking of a gate. It should be noted that for a particular noise pulse with given width and height the electrical masking is higher for a gate with higher fanout load. We estimate the electrical observability (which has a inverse relation to electrical masking) of a gate i at its output net as follows, $$ElectricalObserv(i) = \frac{1}{CL(i)} \qquad (7)$$

Where CL(i) is the capacitive load at node i. In general, the NRC curve can be expressed analytically as well and the inverse relationship to fanout load can be shown mathematically as well under some simplifying assumptions. The maximum electrical observabillity in the circuit is used to normalize the node electrical observability.

A pessimistic estimate of a timing window is determined such that noise existing in that timing window (TW) will reach the primary outputs and get latched in the output flops. The TW observability at each node is estimated by computing the difference between the maximum and the minimum delay from that node to any primary output. Thus, the TW observability of a gate i at its output net can be expressed mathematically as follows, $$TwObserv(i) = \max_{j \in PO}(PathToPO(ij)) - \min_{j \in PO}(PathtoPO(ij)) \qquad (8)$$

where PathToPO(ij) is the path delay from any primary output j to the node i and PO is the set of primary outputs of the circuit. TW observability can be computed recursively by computing the maximum and minimum PathToPO(ij) from the sink (primary outputs) to source (primary inputs) while visiting nodes in the reverse topological order. The maximum and minimum PathToPO(ij) at the gate outputs connected directly to the primary outputs are set to 0. The gate delay is added while going from the gate output to the gate input. When a stem is encountered, the maximum (minimum) of the max (min) of PathToPO(ij) at the branches is computed. Thus, this pessimistic metric assigns higher values of TW observability to nodes which have different path delays to the primary outputs. Intuitively, this makes sense, as the radiation induced noise pulse can occur in a wider time window and still get captured in the output flops making the node more vulnerable. This metric is also normalized by dividing the TW observability at a gate output by the maximum TW observability found in the circuit. Finally, a cumulative probability of observability (CPO) for each gate output is computed which captures all the three masking effects cumulatively. The CPO of gate i at its output can thus be expressed as, $$CPO(i) = LogicalObserv(i) \times ElectricalObserv(i) \times TwObserv(i) \qquad (9)$$

It should be noted, that while the logical observability has higher values for gates near the primary outputs, the TW observability is quite less. The internal gates which are farther away from the primary outputs have more unbalanced delay paths to the primary outputs and hence have higher values of TW observability. However, for these nodes, the logical observability is quite less.

As previously discussed, the SER savings by using the radiation jammer circuit of the present invention may be nullified due to the overheads in delay and area. The overheads for protecting standard cells with the radiation jammer circuit may be reduced by enforcing the use of SCCG gates. However, blind protection by the use of radiation jammer circuit on all gate output nodes will result in significant overheads.

Accordingly, the present invention provides a method for the selective insertion of radiation jammer circuits on cell outputs to provide reduction in circuit SER with very low performance and area overheads. The CPO metric from equation (9) is leveraged to selectively optimize vulnerable circuit nodes. Thus, the asymmetric distribution of SER masking probability is used to provide high SER savings for the circuit while marginally impacting delay and area.

A combinational circuit without feedback can be modeled as a directed acyclic graph (DAG). The DAG can be made polar by assigning a dummy source node connected to all primary inputs and a sink node connected to all primary outputs. The earliest arrival time (EAT) of each net can now be computed by traversing the DAG in the topologically sorted order from the source and assigning the EAT of a gate output as the maximum of the EATs of its inputs plus the delay of the gate. Similarly, the latest arrival time (LAT) of each net can be computed by traversing the DAG in the topologically sorted order from the sink and assigning the LAT of a gate input as the minimum of the LATs of its outputs minus the delay of the gate. The difference of the LAT and the EAT provides the slack for each net.

The probability for radiation jammer insertion (PRI) of each gate output is now computed by taking a weighted combination of the slack and the CPO at each cell output net. Thus the PRI at the output of a gate i can be expressed as, $$PRI(i) = W_{SER} \times CPO(i) + W_{slack} \times slack(i) \qquad (10)$$

where CPO(i) and slack(i) indicate the CPO and the slack at the corresponding gate output, while $W_{SER}$ and $W_{slack}$ are user defined weights to tradeoff SER optimization and the corresponding delay overhead. A higher value of PRI of a gate output indicates that the corresponding net has a high slack and is highly susceptible for soft errors upsets at the registers or primary outputs due to radiation strikes on the active area of the gate. Thus, protecting selective circuit nodes having higher PRI values ensures that radiation jammer cells protect nodes on the non-critical path, but those which are highly susceptible to soft errors. A set of M % of the gate nodes, $G_M$, are selected by sorting the various gate output nets based on its PRI values. Choosing various values of M can be used to tradeoff SER reduction with area and delay overhead.

The proposed algorithm for the selective insertion of RAD-JAM circuits for SER optimization is summarized below:
(i) Perform technology mapping to structural netlist.
(ii) Read in structural netlist as a graph and create a polar DAG with source and sink nodes.
(iii) Estimate the logical observability of all the nets using the signal probability at the primary inputs.
(iv) Populate the load caps at each internal node and compute the electrical observability of all internal nets.
(v) Populate node delays using the gate type and the load cap and compute timing window observability for each net.
(vi) Compute the CPO of each net.
(vii) Perform a topological sort from the source node and calculate the EAT of each net.
(viii) Perform a topological sort from the sink node and calculate the LAT of each net.
(ix) Compute the slack of each net.
(x) Compute the PRI values of each net by taking the product of the CPO and the slack.
(xi) Select the M % topmost gates based PRI values ($G_M$).
(xii) Radiation jammer cells are inserted at the output of the gates selected in $G_M$.

Figure 7:
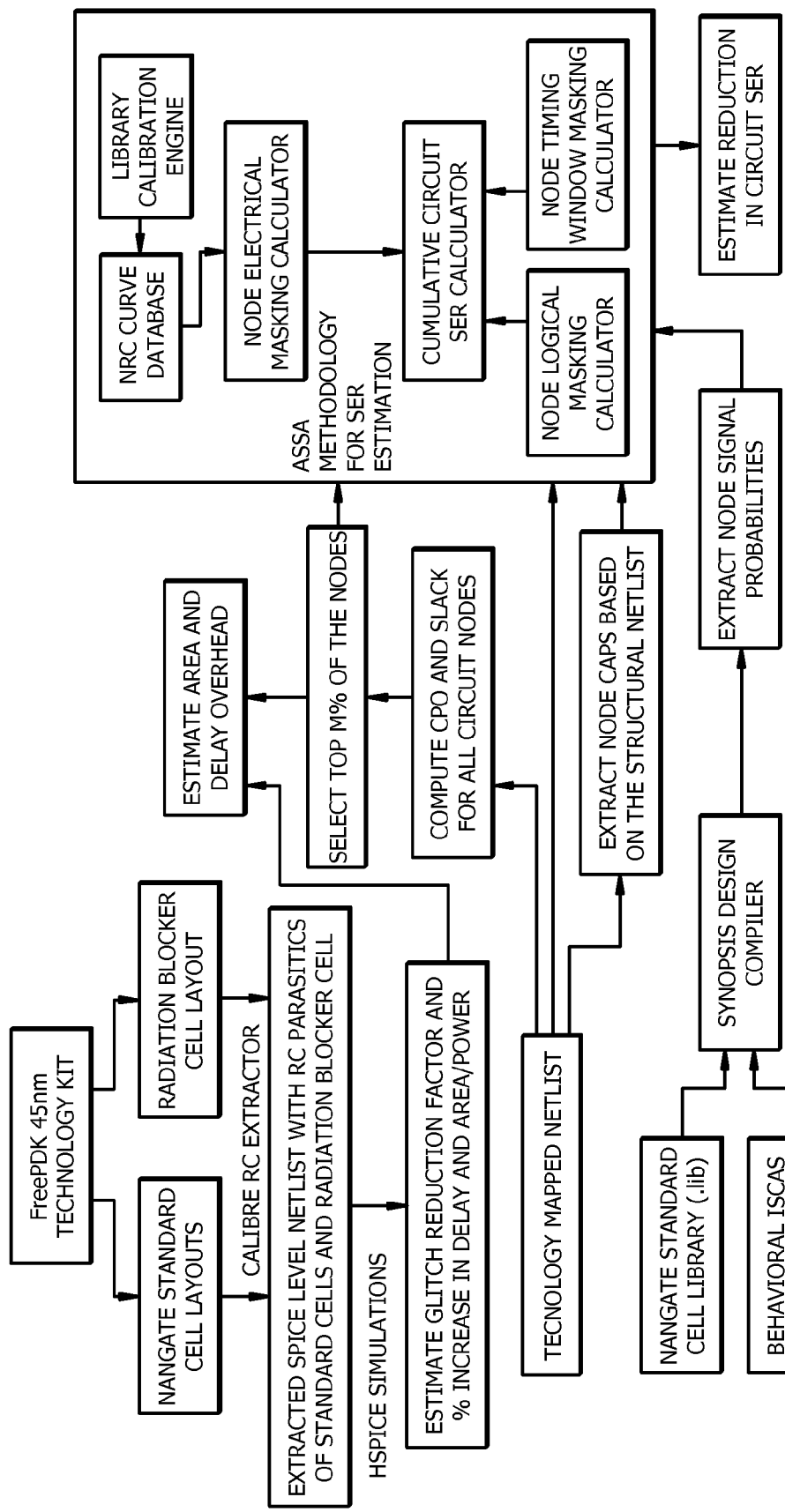
FIG. 7 is a flow diagram illustrating the simulation flow for SER reduction using the radiation jammer circuit in accordance with the present invention.

As shown, the algorithm starts with an initial technology mapped netlist and then computes the CPO and slack values for each net. The PRI values are then computed for each gate output. The top M % of the gates based on PRI values are selected for insertion of radiation jammer circuits in accordance with the present invention. The computational complexity of the algorithm (not considering technology mapping) is dominated by use of computation of topological sort which is used for computation of CPO (steps iii and v) and slack at the gate outputs (steps vii and viii). The computational complexity of topological sort depends on running DFS on the circuit graph and roughly proportional to $O(n^2)$ when n i is the number of gates in the circuit. Steps ii, iv, vi, ix and x are linear in time and hence are proportional to $O(n^2)$ while step xi is constant in time ($O(1)$). Thus the overall computational complexity of the algorithm is quadratic in the number of gates. The overall simulation flow is illustrated in FIG. 7.

With reference to FIG. 8, experimental results for ISCAS85 benchmarks are shown for reduction in SER along with the corresponding overheads in delay and area. The results are reported for varying values of M with the corresponding $W_{SER}$ and $W_{slack}$ being fixed at 0.9 and 0.1 respectively. The SER reduction was calculated as the decrease in SER of the selectively protected circuit compared with the SER of the original circuit divided by the original SER. Similarly, the delay (area) was calculated as the increase in delay (area) of the selectively protected circuit compared with the delay (area) of the original circuit divided by the original delay (area). As illustrated with reference to FIG. 8, implementation of the radiation jammer circuit in accordance with the present invention, on average, the approach of the present invention can achieve SER reduction as much as 51% with area overhead of 18% and delay overhead of only 0.2%. Since power scales very well with the circuit area, it is believed that the power overhead of the present invention will also be quite less.

Figure 9:
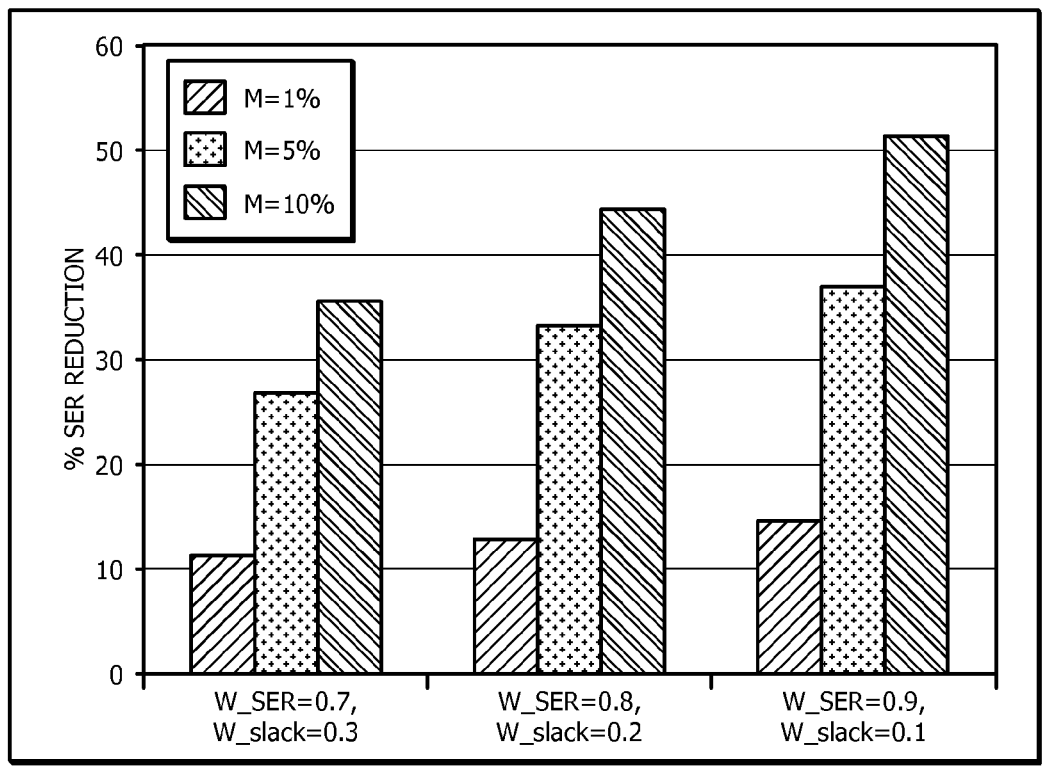
FIG. 9 is a bar graph illustrating the comparison of SER reduction for different user defined parameters.
Figure 10:
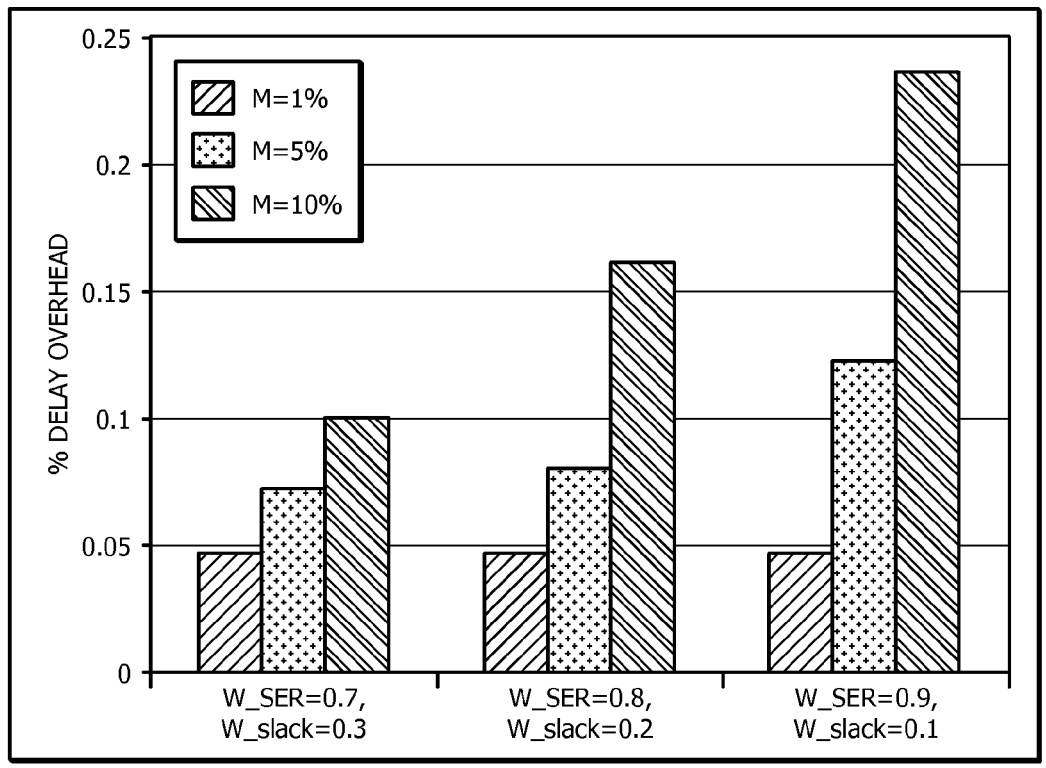
FIG. 10 is a bar graph illustrating the comparison of delay overhead for different user defined parameters
Figure 11:
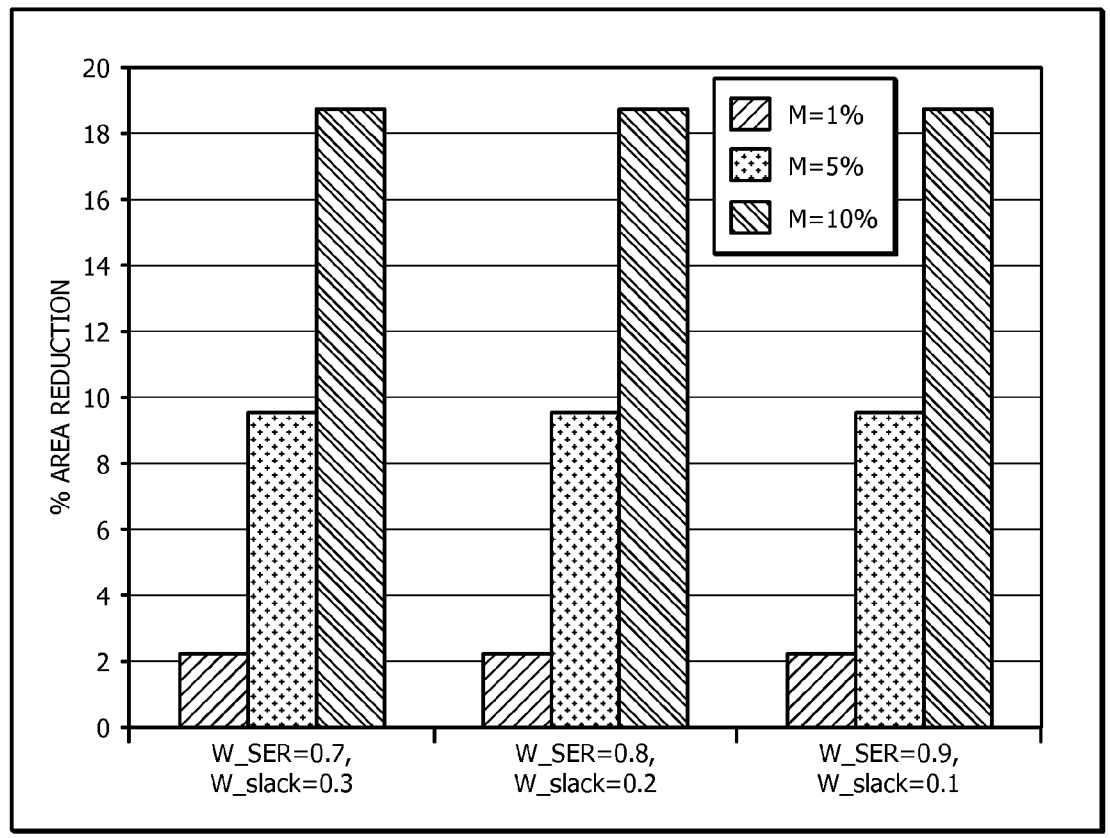
FIG. 11 is a bar graph illustrating the comparison of area overhead for different user defined parameters.

Experiments were also conducted by varying the weights for providing relative importance to SER and slack during computation of PRI values at various values of M. The results of these comparisons are illustrated in FIGS. 9-11. As shown in FIG. 9, the rate of SER reduction increases significantly when providing higher values to $W_{SER}$ while as shown in 10, increase in delay overhead is only marginal. The effect is especially pronounced at higher values of M. As shown in FIG. 13, changing the weights $W_{SER}$ and $W_{slack}$ at a fixed value of A does not affect area overhead, which is expected.

The comparison of the present invention to other circuit level works for improving SER is not straight forward, since the base simulation platform for the methods are quite different. For example, the shadow gate techniques uses 65 nm BPTM technology for their simulations while the Schmitt trigger based technique uses 0.35 um technology libraries for their experiments. Therefore, a qualitative comparison of the present invention with other circuit level techniques for node hardening is provided.

The shadow gates with diode clamper based techniques incur a low delay overhead for hardening circuit nodes. However, the duplication of entire cells leads to high area overheads. This is especially true for complex standard cells with many transistors. The area overhead of the present invention is, on the other hand, irrespective of the type of standard cell. In fact it is shown that, the SCCG gates using the radiation jammer circuit in accordance with the present invention incur relatively low area overheads. Also, due to process variations, duplicate gates in the shadowing technique may not have the exact delay as the original gate. This in turn may affect the performance of the hardened standard cell. The present invention does not suffer through such a limitation.

Complimentary pass gates can act as a low pass filter for glitches induced by radiation strikes. However, the method can only eliminate transient pulses with low or moderate magnitudes. High amplitude pulses are attenuated but are not completely eliminated. Hence, protection against a subset of radiation induced SETs can only be achieved. Otherwise, large sized pass gates or a chain of pass gates need to be used. This can make it expensive in terms of delay for realistic radiation flux found in sea level.

The Schmitt trigger based technique uses explicit feedback of stored charge to fight the transient charges injected during a radiation strike. This idea has also been used in the context of dynamic gates or latches and for static CMOS circuits. However, due to technology scaling, a lesser amount of charge is stored in the feedback node. This seriously impacts the glitch reduction capability of these circuits at scaled technology nodes especially where the soft error problem becomes an even bigger challenge.

In contrast, the present invention uses the characteristic of the radiation induced transient itself to detect the occurrence of a radiation strike and cuts the affected cell hit by the strike from providing input drive to the driven cell.

We also note that many works exist for selective sizing of gates of a circuit and simultaneous sizing and flip-flop selection for SER reduction. However, the present invention is not comparable to these logic level sizing approaches which predominantly depends on level hardening. Such sizing approaches can be applied over and above the technique of the present invention to further reduce the circuit SER.

The present invention provides a transistor level circuit which can significantly reduce soft error transients in logic circuits. The proposed radiation jammer circuit could be expensive if applied blindly to all the nodes in the circuit. Towards this, an intelligent algorithm is proposed which inserts radiation jammer cells selectively on soft error vulnerable nodes in the non-critical paths of a circuit. Experimental results on ISCAS85 circuits indicate that the proposed methodology can reduce the SER in logic circuits by about 51% with area overheads of 18% and delay overhead of only 0.2%.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method to prevent the propagation of a single event transient glitch from a driving logic cell to a driven logic cell, the method comprising:
    receiving a transient glitch at an output of a driving logic cell;
    generating a voltage drop across a resistive element of a resistor-capacitor (RC) differentiator circuit coupled to the output of the driving logic cell, the voltage drop generated as a result of the received transient glitch; and
    controlling a gate-body voltage of a depletion mode MOS device with the voltage drop generated across the resistive element, wherein the depletion mode MOS device is coupled between the output of the driving logic cell and an input to the driven logic cell, and wherein the voltage drop generated across the resistive element as a result of the transient glitch is sufficient to place the depletion mode MOS device in cut-off, thereby disconnecting the driving logic cell from the driven logic cell to prevent the propagation of the transient glitch.

2. The method of claim 1, further comprising maintaining a substantially constant capacitance value across a capacitive element of the RC differentiator circuit for a predetermined voltage range.

3. The method of claim 1, wherein the depletion mode MOS device comprises a depletion mode NMOS transistor in series with a depletion mode PMOS transistor, and when the gate-body voltage resulting from the transient glitch is positive, the depletion mode NMOS transistor is placed in cut-off and when the gate-body voltage resulting from the transient glitch is negative, the depletion mode PMOS transistor is placed in cut-off.

4. The method of claim 1, further comprising inserting a radiation jammer circuit between the driving logic cell and the driven logic cell, the radiation jammer circuit comprising the RC differentiator circuit and the depletion mode MOS device.

5. The method of claim 4, wherein the driving logic cell and the driven logic cell are cells within an integrated circuit, and wherein inserting the radiation jammer circuit further comprises inserting the radiation jammer circuit selectively on soft error vulnerable nodes in the non-critical paths of the integrated circuit.

6. The method of claim 5, wherein inserting the radiation jammer circuit electively on soft error vulnerable nodes in the non-critical paths of the integrated circuit further comprises:
    performing technology mapping to generate a mapped netlist of gate outputs;
    computing a cumulative probability of observability value for each gate output of the netlist;
    computing a slack value for each gate output of the netlist;
    computing a probability for radiation jammer circuit insertion value for each gate output of the netlist; and
    selecting the top M % of the gates based on the probability for radiation jammer circuit insertion value for insertion of radiation jammer circuit.

7. The method of claim 6, further comprising reading in the mapped netlist as a graph to create a polar directed acyclic graph (DAG).

8. The method of claim 6, wherein computing the cumulative probability of observability value for each gate output of the netlist further comprises:
    computing the logical observability for each gate output;
    computing the electrical observability for each gate output;
    computing the timing window observability for each gate output; and
    computing the cumulative probability of observability value by summing the logical observability, the electrical observability and the timing window observability.

9. The method of claim 6, wherein computing a slack value for each gate output of the netlist further comprises:
    computing the earliest arrival time for each gate output;
    computing the latest arrival time for each gate output; and
    computing the slack value as the difference between the earliest arrival time and the latest arrival time.

10. The method of claim 6, wherein computing a probability for radiation jammer circuit insertion value for each gate output of the netlist further comprises computing a weighted combination of the slack value and the cumulative probability of observability value.

11. The method of claim 6, further comprising varying the value of M to obtain a desired soft error reduction in combination with a desired area and delay overhead.

* * * * *